(12) United States Patent
Chen et al.

(10) Patent No.: US 12,399,200 B2
(45) Date of Patent: Aug. 26, 2025

(54) INFORMATION ACQUISITION DEVICE AND INFORMATION ACQUISITION METHOD FOR PULSATING VOLTAGE

(71) Applicant: National Taiwan University, Taipei (TW)

(72) Inventors: Yaow-Ming Chen, Taipei (TW); Chia-Chou Chang, Taipei (TW); Zhen-Jia Chen, Taipei (TW)

(73) Assignee: National Taiwan University, Taipei (TW)

( * ) Notice: Subject to any disclaimer, the term of this patent is extended or adjusted under 35 U.S.C. 154(b) by 152 days.

(21) Appl. No.: 18/390,320

(22) Filed: Dec. 20, 2023

(65) Prior Publication Data

US 2025/0138064 A1 May 1, 2025

(30) Foreign Application Priority Data

Nov. 1, 2023 (TW) .................................. 112141923

(51) Int. Cl.
| | | |
|---|---|---|
| *G01R 19/255* | (2006.01) | |
| *G01R 19/00* | (2006.01) | |
| *G01R 19/25* | (2006.01) | |
| *G01R 31/34* | (2020.01) | |

(52) U.S. Cl.
CPC ......... *G01R 19/255* (2013.01); *G01R 19/003* (2013.01); *G01R 19/0053* (2013.01); *G01R 19/2509* (2013.01); *G01R 31/343* (2013.01)

(58) Field of Classification Search
CPC ............................ G01R 19/255; G01R 19/003; G01R 19/0053; G01R 19/2509; G01R 31/343

USPC .................................. 324/76.39, 76.11, 76.16
See application file for complete search history.

(56) References Cited

U.S. PATENT DOCUMENTS

| | | | | |
|---|---|---|---|---|
| 12,339,301 B2 * | 6/2025 | Zhu | ...................... | G01R 19/003 |
| 2009/0153156 A1 | 6/2009 | Ishii | | |
| 2017/0199232 A1 * | 7/2017 | Jahnke | .................... | G01R 19/25 |
| 2018/0131279 A1 | 5/2018 | Sun et al. | | |
| 2022/0099712 A1 * | 3/2022 | De Fazio | ............ | H02M 1/0009 |
| 2022/0114303 A1 | 4/2022 | Lin et al. | | |

FOREIGN PATENT DOCUMENTS

WO    WO02091565 A2    11/2002

\* cited by examiner

*Primary Examiner* — Giovanni Astacio-Oquendo
(74) *Attorney, Agent, or Firm* — Best & Flanagan LLP

(57) ABSTRACT

The present invention provides an information acquisition device and method for a pulsating voltage. The device uses a signal isolation circuit to receive a switch-controlling voltage of a motor driver and outputs a logic voltage. When a signal processing module receives the logic voltage from the signal isolation circuit, the signal processing module starts a counter and determines whether a rising or falling edge is present in the logic voltage. When determining that a first rising edge, a first falling edge, and a second rising edge are respectively present in the logic voltage, the signal processing module respectively stores a value of the counter as a first counter value, a second counter value, and a third counter value, and proceeds to calculate a voltage duty cycle of a motor-switching period based on the counter values. The present invention calculates the voltage duty cycle with improved accuracy.

11 Claims, 6 Drawing Sheets

INFORMATION ACQUISITION DEVICE AND INFORMATION ACQUISITION METHOD FOR PULSATING VOLTAGE

CROSS-REFERENCE TO RELATED APPLICATION(S)

This application claims the priority benefit of TW application serial No. 112141923 filed on Nov. 1, 2023, the entirety of which is hereby incorporated by reference herein and made a part of the specification.

BACKGROUND OF THE INVENTION

1. Field of the Invention

The present invention relates to an information acquisition device and an information acquisition method for a pulsating voltage, wherein an electrical value can be accurately calculated based on the measured pulsating voltage.

2. Description of the Related Art

As electric machines improve, various types of electric motors, such as electric vehicle motors, also improve their craft to match the society's ever higher expectations and fulfill customer demands. In order to efficiently improve and develop various types of electric motors, engineers utilize an electronic motor emulator (EME) to simulate electrical values needed to sustain a working electric motor. For example, in the technical field of EME, the EME samples an electrical signal from a motor driver, wherein the motor driver is a device under test (DUT). The EME then uses the sampled electrical signal and a motor model within the EME to emulate a voltage information required for sustaining the motor driver. In other words, the EME measures a voltage value from the motor driver and provides the measured voltage to the motor model in real time for the motor model to conduct calculations.

However, traditionally the measurement of the voltage value provided to the motor model includes the following steps: first using an analog circuit to obtain an analog pulsating wave profile of a motor model, then after filtering the analog pulsating wave profile, further using an analog-to-digital converter (ADC) to convert the analog pulsating wave profile into a digital signal, and then using a processor to execute calculations based on the digital signal.

The traditional method for obtaining the voltage value provided to the motor model has a few drawbacks. From the step of having the analog circuit obtaining the analog pulsating wave profile to the step of converting the analog pulsating wave profile into the digital signal, the traditional method is susceptible to noise interferences, such as being affected by switching-frequency harmonics of switching the motor driver on and off. In order to eliminate such noise, traditionally a low-pass filter is used for noise filtering. However, by doing so, a new problem arises as the step of having the analog circuit obtaining the analog pulsating wave profile to the step of converting the analog pulsating wave profile into the digital signal would be significantly delayed. Furthermore, since such time delay involves phase changes of the pulsating wave profile, engineers would find it hard to accurately quantize and define such time delay in the time domain.

Due to the above reasons, the traditional method for obtaining the voltage value calls for a compensation between having excessive phase delay and having sufficient filtering quality of the pulsating wave profile. When the analog pulsating wave profile is sufficiently filtered, the low-pass filter causes greater time delay for the filtered pulse wave. Conversely, when the analog pulsating wave profile is filtered with a lesser quality, although the low-pass filter causes less time delay for the filtered pulse wave, the filtered pulse wave retains more high frequency noise. Both noise and time delay with phase shifts of the pulsating wave profile negatively affect an accuracy for calculating the voltage value provided to the motor model, and thus by using the said traditional method, the voltage value provided to the motor model cannot be accurately obtained.

SUMMARY OF THE INVENTION

To improve acquisition accuracy of a voltage value sensed from a motor driver. The present invention provides an information acquisition device and an information acquisition method for a pulsating voltage. The present invention filters noise from a pulse that is being measured without incurring phase delays between the pulse and an electrical value calculated based on the pulse, and thus the present invention is able to more accurately calculate the electrical value calculated based on the pulse.

The information acquisition device of the present invention includes a signal isolation circuit and a signal processing module. The signal isolation circuit is utilized for receiving a switch-controlling voltage of the motor driver, and the signal isolation circuit outputs a logic voltage based on the switch-controlling voltage of the motor driver. The signal processing module is electrically connected to the signal isolation circuit. When the signal processing module receives the logic voltage from the signal isolation circuit, the signal processing module starts a counter, and determines whether a rising edge or a falling edge is present in the logic voltage.

When the signal processing module determines that the rising edge is present in the logic voltage for a first time, the signal processing module stores a value of the counter as a first counter value.

When the signal processing module determines that the falling edge is present in the logic voltage for a first time, the signal processing module stores the value of the counter as a second counter value, then resets the counter and starts the counter again.

When the signal processing module determines that the rising edge is present in the logic voltage for a second time, the signal processing module stores the value of the counter as a third counter value.

The signal processing module then calculates a voltage duty cycle of a motor-switching period based on the first counter value, the second counter value, and the third counter value.

The information acquisition method of the present invention is executed by a signal processing module. The information acquisition method of the present invention includes the following steps:

when receiving a logic voltage from a signal isolation circuit, starting a counter, and determining whether a rising edge or a falling edge is present in the logic voltage;

when determining that the rising edge is present in the logic voltage for a first time, storing a value of the counter as a first counter value;

when determining that the falling edge is present in the logic voltage for a first time, storing the value of the counter as a second counter value, then resetting the counter and starting the counter again;

when determining that the rising edge is present in the logic voltage for a second time, storing the value of the counter as a third counter value; and calculating a voltage duty cycle of a motor-switching period based on the first counter value, the second counter value, and the third counter value.

The present invention uses the signal isolation circuit to eliminate voltage noise of the switch-controlling voltage of the motor driver before outputting the logic voltage, and the logic voltage outputted by the signal isolation circuit is the pulse that is being measured by the present invention. Furthermore, the electrical value calculated based on the logic voltage is the voltage duty cycle of the motor-switching period calculated by the present invention. By obtaining the voltage duty cycle, the present invention enables more possibilities to conduct further calculations for a motor model of an electronic motor emulator (EME) that emulates the motor driver, for example, to further calculate an averaged voltage value needed to sustain a converter of the motor driver according to the motor model of the EME.

An important point of the present invention is, rather than having time delay with phase changes as mentioned in the prior art, the voltage duty cycle calculated by the present invention only has a fixed amount of time delay from the logic voltage received by the present invention. For this reason, the present invention is able to more accurately calculate the electrical value after obtaining the logic voltage, such as more accurately calculating the averaged voltage value needed for the motor model of the EME to sustain the converter of the motor driver. In other words, the logic voltage of the present invention is not only filtered, but also maintains the fixed amount of time delay with the voltage duty cycle calculated by the present invention. As such, the present invention provides the electrical value that has better quality, better time-accuracy, and better adaptability to be used for further calculations, such as providing the electrical value as the averaged voltage value needed for the EME to sustain the converter of the motor driver.

DETAILED DESCRIPTION OF THE INVENTION

The present invention provides an information acquisition device for a pulsating voltage and an information acquisition method for a pulsating voltage.

Figure 1:
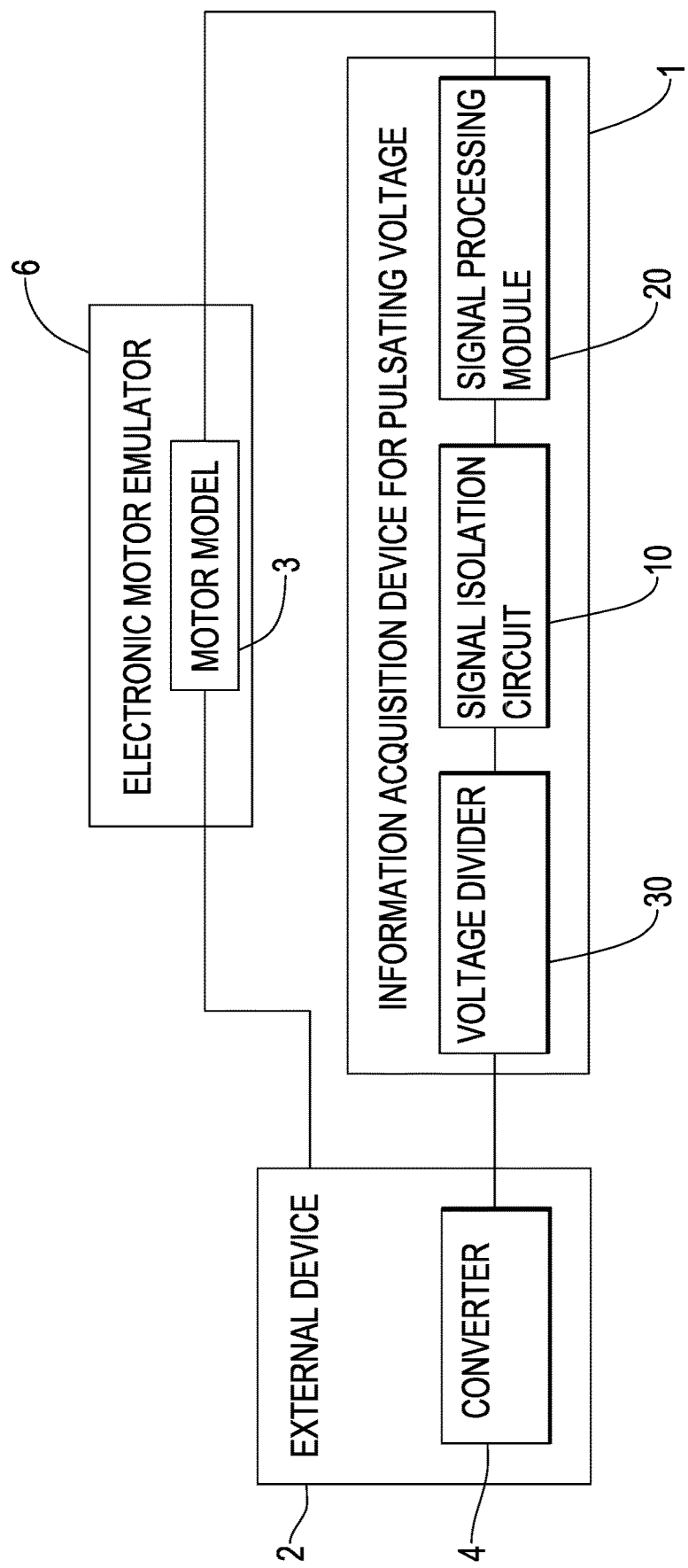
FIG. 1 is a block diagram of an information acquisition device for a pulsating voltage of the present invention.

With reference to FIG. 1, an information acquisition device 1 for a pulsating voltage includes a signal isolation circuit 10 and a signal processing module 20. The signal isolation circuit 10 is utilized for receiving a switch-controlling voltage. The switch-controlling voltage originates from an external device 2, and the external device 2 is electrically connected to the information acquisition device 1 of the present invention.

In an embodiment of the present invention, the external device 2 is a motor driver, and the motor driver includes a converter 4. As such, the motor driver is a device under test (DUT). An electronic motor emulator (EME) 6 is electrically connected to both the external device 2 and the information acquisition device 1. More particularly, the EME 6 includes a motor model 3, and the EME 6 senses an electric signal from the converter of the DUT through the help of the information acquisition device 1, and then uses the sensed electrical signal for the motor model 3 to simulate different electric signals for emulating the motor driver. For example, the EME 6 simulates that when the converter 4 is given electricity for switching switches, how much average voltage is needed to sustain such switching operation. For example, the information acquisition device 1 senses a motor-switch voltage from the converter 4 of the DUT that switches between zero volt (V) and 350 volts, and the motor-switch voltage is a square wave for controlling the conductions of the switches of the converter 4. However, a voltage duty cycle of a motor-switching period for controlling the switching operation of the converter 4 is still unknown for the EME 6, and therefore an averaged voltage value required for the EME 6 to have the motor model 3 to emulate electric signals for the DUT is still unknown.

Figure 2:
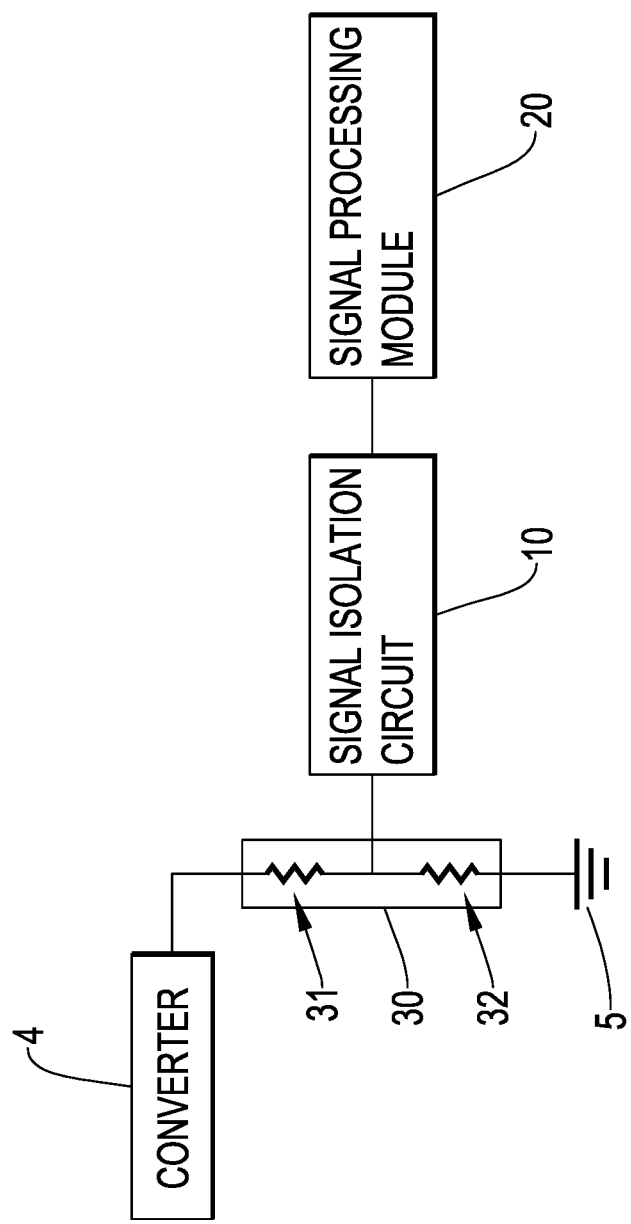
FIG. 2 is a perspective view of a voltage divider of the information acquisition device of the present invention.

With reference to FIG. 2, in the aforementioned embodiment of the present invention, the motor-switch voltage of the converter 4 is switching between 0V and 350V, and since 350V is too high of a voltage for digital signal processing, the motor-switch voltage needs to be lowered by a voltage divider 30 of the information acquisition device 1 before entering the signal isolation circuit 10. The voltage divider 30 includes a first resistor 31 and a second resistor 32. The first resistor 31 has two opposite sides, wherein one of the sides is electrically connected to the converter 4, and the other side is electrically connected to the second resistor 32 and the signal isolation circuit 10. The second resistor 32 also has two opposite sides, wherein one of the sides is electrically connected to the first resistor 31 and the signal isolation circuit 10, and the other side is electrically connected to a ground 5.

In an embodiment, an electrical resistance of the first resistor 31 is 68-folds more than an electrical resistance of the second resistor 32. As such, the motor-switch voltage is divided with a ratio of 1:69 into the switch-controlling voltage of roughly 5V by the voltage divider 30. The voltage divider 30 further outputs the switch-controlling voltage to the signal isolation circuit 10, and thus, the switch-controlling voltage is a square wave voltage that switches between 0V and 5V.

The signal isolation circuit 10 stores an upper voltage threshold and a lower voltage threshold, with the upper voltage threshold being greater than the lower voltage threshold. In the present embodiment, the upper voltage threshold is 3.5V, and the lower voltage threshold is 1.5V. When the switch-controlling voltage received by the signal isolation circuit 10 is between the upper voltage threshold and the lower voltage threshold, the signal isolation circuit 10 outputs the logic voltage that has been noise-filtered to the signal processing module 20.

Furthermore, when the switch-controlling voltage is between the upper voltage threshold and the lower voltage threshold, the motor-switch voltage has a hysteresis voltage of roughly between 105V and 245V. This means that when the signal isolation circuit 10 outputs the logic voltage that has been noise-filtered to the signal processing module 20, the motor-switch voltage is the hysteresis voltage of roughly between 105V and 245V.

The logic voltage is a transistor-transistor logic (TTL) signal, as the upper voltage threshold and the lower voltage threshold are both respectively set by different transistors executing different voltage-dependent operations with different voltage thresholds. Furthermore, the signal isolation circuit 10 may be an integrated circuit (IC) chip, and the circuit designs of the IC chip are free to be of any kind as long as the IC chip satisfies the aforementioned functionality required of the signal isolation circuit 10.

The signal isolation circuit 10 of the present invention is able to filter voltage noise as the signal isolation circuit 10 is able to tolerate the switch-controlling voltage with up to 3.5V of voltage fluctuations, or rather an equivalent of tolerating the motor-switch voltage with up to 245V of voltage fluctuations. Furthermore, a noise filtering ability of the signal isolation circuit 10 of the present invention is better than a noise filtering ability of the traditional method mentioned in prior art. Using the traditional method mentioned in prior art, when peripheral components of an analog-to-digital converter (ADC) receive 3V of maximum voltage and also use 12-bits resolution for noise-filtering, merely a noise voltage of 0.732 millivolt (mV) is enough to affect and compromise the noise filtering ability of the traditional method, yielding a noisy voltage signal. In other words, the present invention has a higher noise tolerance than prior art. The present invention tolerates voltage fluctuations up to 70% of the maximum voltage value received, as 3.5V divided by 5V of the maximum switch-controlling voltage equals 70%. In contrast, the prior art only tolerates voltage fluctuations up to 24.4% of the maximum voltage value received, as 0.732V divided by 3V of maximum voltage equals 24.4%. As such, the present invention has a better noise filtering ability in comparison to prior art.

Very importantly, the motor-switch voltage and the switch-controlling voltage have identical phases, as the two voltages differ only because of the voltage divider 30. Furthermore, the switch-controlling voltage and the logic voltage are also identical, with the only difference being that when the switch-controlling voltage fluctuates outside of the voltage range between the upper voltage threshold and the lower voltage threshold, the signal isolation circuit 10 outputs the logic voltage with different voltage values. In other words, even if the signal isolation circuit 10 of the present invention causes time delay when filtering voltage noises, such time delay caused by the signal isolation circuit 10 of the present invention has a fixed amount of time delay, rather than a time delay caused by phase changes for filtering noise as detailed in prior art. The time delay of the present invention is fixed, because time is fixed for the logic voltage to transition between a higher voltage value and a lower voltage value.

The signal processing module 20 is electrically connected to the signal isolation circuit 10. In an embodiment, the signal processing module 20 is an enhanced capture module (eCAP module) within a digital signal processor (DSP). In other embodiments, the signal processing module 20 may also be any other type of module with signal capturing ability, signal processing ability, and counting and computing abilities.

When the signal processing module 20 receives the logic voltage from the signal isolation circuit 10, the signal processing module 20 starts counting a counter from zero, and further the signal processing module 20 determines whether a rising edge or a falling edge is present in the logic voltage.

When the signal processing module 20 determines that the rising edge is present in the logic voltage for a first time, the signal processing module 20 stores a value of the counter as a first counter value. When the signal processing module determines that the falling edge is present in the logic voltage for a first time, the signal processing module 20 stores the value of the counter as a second counter value, then resets the counter to zero and starts the counter again. When the signal processing module 20 determines that the rising edge is present in the logic voltage for a second time, the signal processing module 20 stores the value of the counter as a third counter value. Lastly, the signal processing module 20 then calculates the voltage duty cycle of the motor-switching period based on the first counter value, the second counter value, and the third counter value. In an embodiment, the signal processing module 20 may store the value of the counter as a zeroth counter value when the counter first begins counting from zero. The signal processing module 20 may also store the value of the counter as a zeroing counter value when the signal processing module 20 determines that the falling edge is present in the logic voltage for the first time.

Figure 3A:
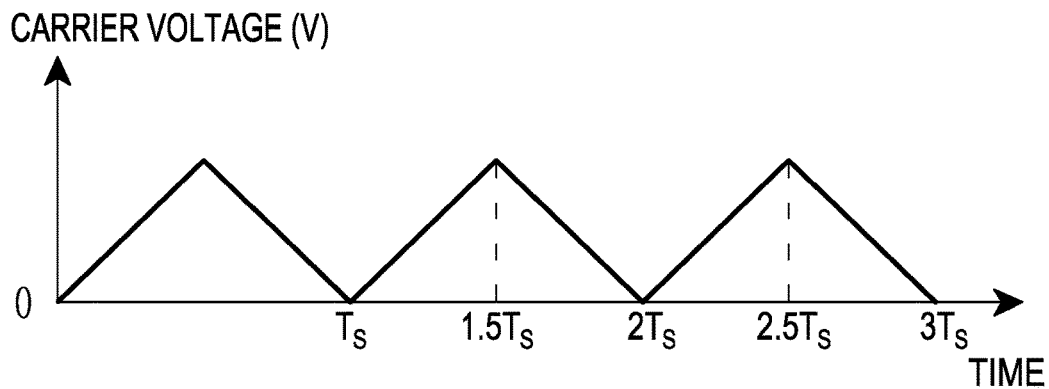
FIG. 3A is a waveform perspective view of a carrier voltage received by the information acquisition device of the present invention.
Figure 3B:
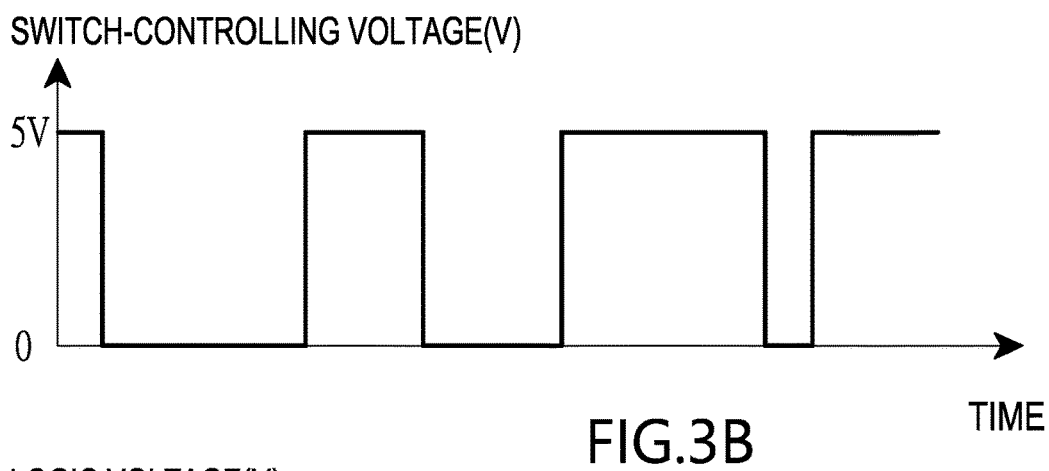
FIG. 3B is a waveform perspective view of a switch-controlling voltage of a motor model received by the information acquisition device of the present invention.
Figure 3C:
FIG. 3C is a waveform perspective view of a logic voltage received by the information acquisition device of the present invention.
Figure 3D:
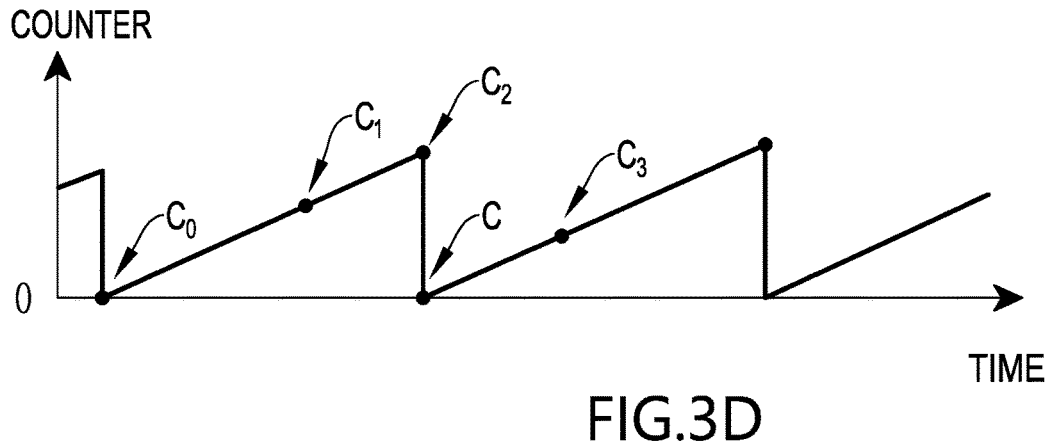
FIG. 3D is a perspective view of a value of the counter used by the information acquisition device of the present invention.

With reference to FIGS. 3A to 3D, the horizontal axes of FIGS. 3A to 3C respectively have units for voltage values (volts), and the horizontal axis of FIG. 3D is unitless. The horizontal axes of FIGS. 3A to 3D respectively have units of time, and the horizontal axes of FIGS. 3A to 3D are all chronically aligned with each other. In the present embodiment, the switch-controlling voltage shown in FIG. 3B and the logic voltage shown in FIG. 3C have the same phases. A carrier voltage of the converter 4 is shown in FIG. 3A. The carrier voltage is a periodic wave, and in the present embodiment, the carrier voltage is a triangle wave. In other embodiments, the carrier wave may also have other waveforms as a periodic wave.

FIG. 3D is a perspective view of the value of the counter counted by the signal processing module 20. FIG. 3D shows how a zeroth counter value $C_0$, a first counter value $C_1$, a second counter value $C_2$, a zeroing counter value C, and a third counter value $C_3$ are positioned chronically in relations to the carrier voltage shown in FIG. 3A, the switch-controlling voltage shown in FIG. 3B, and the logic voltage shown in FIG. 3C. More particularly, rising edges and falling edges of the logic voltage shown in FIG. 3C are chronically aligned when the signal processing module 20 stores the value of the counter as the first counter value $C_1$, the second counter value $C_2$, the zeroing counter value C, and the third counter value $C_3$. In the present embodiment, the counter is counted with a fixed pace, and therefore the counter in FIG. 3D is shown to chronically change with identical slopes. For example, the counter is counted with a clock frequency of 20 megahertz (MHz). In other embodiments, the counter may also be counted as an accumulation of time.

Furthermore, the signal processing module 20 calculates the voltage duty cycle according to the following derived formula:

$$D = \frac{2(C_2 - C_1)}{2C_2 + C_3 - C_1}$$

wherein D represents the voltage duty cycle, $C_1$ represents the first counter value $C_1$, $C_2$ represents the second counter value $C_2$, and $C_3$ represents the third counter value $C_3$. Evidently, according to the formula, the voltage duty cycle is calculatable without needing the zeroth counter value $C_0$ and the zeroing counter value C. The following paragraphs will demonstrate how the formula is derived.

First, according to the zeroth counter value $C_0$, the first counter value $C_1$, the second counter value $C_2$, the zeroing counter value C, and the third counter value $C_3$ stored by the signal processing module 20, the following relations May be written:

$$C_{10} \equiv C_1 - C_0 = C_1$$
$$C_{21} \equiv C_2 - C_1 = C_{ON}$$
$$C_{3C} \equiv C_3 - C_C = C_3$$

wherein, within the formula, $C_0$ represents the zeroth counter value $C_0$, Cc represents the zeroing counter value C, $C_{10}$ represents a difference between the first counter value $C_1$ and the zeroth counter value $C_0$, $C_{21}$ represents a difference between the second counter value $C_2$ and the first counter value $C_1$, and $C_{3C}$ represents a difference between the third counter value $C_3$ and the zeroing counter value C. Furthermore, since a time duration between when the first time the rising edge appears and when the first time the falling edge appears in the logic voltage corresponds to when the square wave of the converter 4 is switched on, the difference between the second counter value $C_2$ and the first counter value $C_1$ can also be recognized as $C_{ON}$, wherein $C_{ON}$ corresponds to a time duration of positive amplitude in a period of the voltage duty cycle.

Furthermore, a full period of the voltage duty cycle can be written as the following:

$$C_S = \frac{C_{10}}{2} + C_{21} + \frac{C_{3C}}{2} = \frac{C_{10} + 2C_{21} + C_{3C}}{2} = \frac{C_1 + 2(C_2 - C_1) + C_3}{2}$$

wherein $C_S$ represents the full period of the voltage duty cycle, also known as a total amount of time needed for the converter 4 to do a cycle of switching the switches. The formula is formulated such that, $C_S$, or the full period of the voltage duty cycle, includes half of time of $C_{10}$ and half of time of $C_{3C}$.

Lastly, by utilizing all of the formulas listed above, the voltage duty cycle can be derived as the following:

$$D = \frac{C_{ON}}{C_S} = \frac{2(C_2 - C_1)}{C_1 + 2(C_2 - C_1) + C_3} = \frac{2(C_2 - C_1)}{2C_2 + C_3 - C_1}.$$

After the signal processing module 20 finishes calculating the voltage duty cycle, the signal processing module 20 proceeds to output the voltage duty cycle to the motor model 3 of the EME 6, for providing the motor model 3 accurate electrical values for further calculations.

In an embodiment, the signal processing module 20 is also obtains the carrier voltage directly from the external device 2. The signal processing module 20 detects a maximum carrier voltage from the carrier voltage, and proceeds to calculate the averaged voltage value needed for the motor model 3 by multiplying the voltage duty cycle by the maximum carrier voltage. The signal processing module 20 may then output the averaged voltage value to the motor model 3, allowing the EME 6 to use the motor model 3 to emulate a sustainable voltage for the converter 4.

Figure 4:
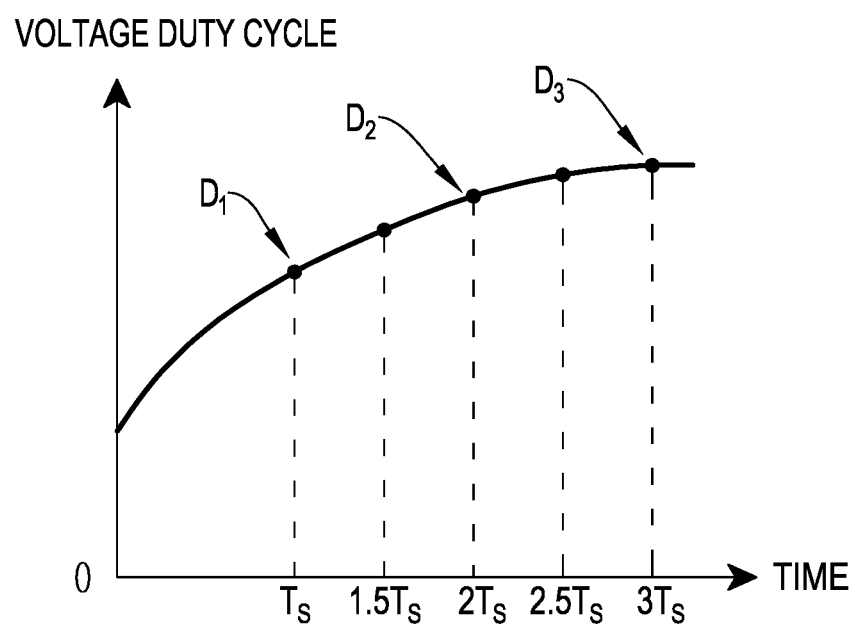
FIG. 4 is a perspective view of changes of a voltage duty cycle calculated by the information acquisition device of the present invention.

With reference to FIGS. 3A and 4, the carrier voltage completes a revolution of a first period time Ts, another revolution of a second period time 2Ts, and yet another revolution of a third period time 3Ts in FIG. 3A. Although the carrier voltage has an identical period, the voltage duty cycle in fact can possibly change over time. For instance, with reference to FIG. 4, following the previously mentioned logic, calculations can be made to iteratively calculate multiple voltage duty cycles such as a first voltage duty cycle $D_1$, a second voltage duty cycle $D_2$, and a third voltage duty cycle $D_3$. Furthermore, the first period time Ts corresponds to the first voltage duty cycle $D_1$, the second period time 2Ts corresponds to the second voltage duty cycle $D_2$, and the third period time 3Ts corresponds to the third voltage duty cycle $D_3$. The first voltage duty cycle $D_1$, the second voltage duty cycle $D_2$, and the third voltage duty cycle $D_3$ are all different from each other as the iteratively calculated voltage duty cycles change over time.

Since the carrier voltage is periodic and symmetric in its waveform, with reference to FIG. 3A, each peak of the carrier voltage is a middle point of each of the voltage duty cycles. Since calculations of the full period of the voltage duty cycle involve taking in considerations of two possibly different voltage duty cycles, the present invention, in an embodiment, calculates multiple voltage duty cycles and then averages over the calculated voltage duty cycles. In other words, since the first counter value $C_1$ stored by the signal processing module 20 belongs to a voltage duty cycle, and the second counter value $C_2$ and the third counter value $C_3$ respectively stored by the signal processing module 20 belong to another voltage duty cycle, the voltage duty cycle calculated by the present invention is in fact positioned between two possibly changing voltage duty cycles. Therefore, for example, with reference to FIG. 4, a first in-between time 1.5Ts exists in the middle between the first period time Ts and the second period time 2Ts, and a second in-between time 2.5Ts exists in the middle between the second period time 2Ts and the third period time 3Ts. Assuming the change between the first voltage duty cycle $D_1$ and the second voltage duty cycle $D_2$ is linear in time, then generalization can be made that an average value of the first voltage duty cycle $D_1$ plus the second voltage duty cycle $D_2$ and divided by two equals to the voltage duty cycle calculated for the first in-between time 1.5Ts. Despite the voltage duty cycle calculated for the first in-between time 1.5Ts can only be calculated at the second in-between time 2.5Ts with a time delay, the voltage duty cycle calculated by the present invention can still accurately represent the voltage duty cycle from a fixed amount of time ago. Given the time delay of calculating the voltage duty cycle is just a fixed amount of time and without phase changes, the present invention is still better at using the logic voltage to more accurately calculate the voltage duty cycle without phase deviations.

Figure 5:
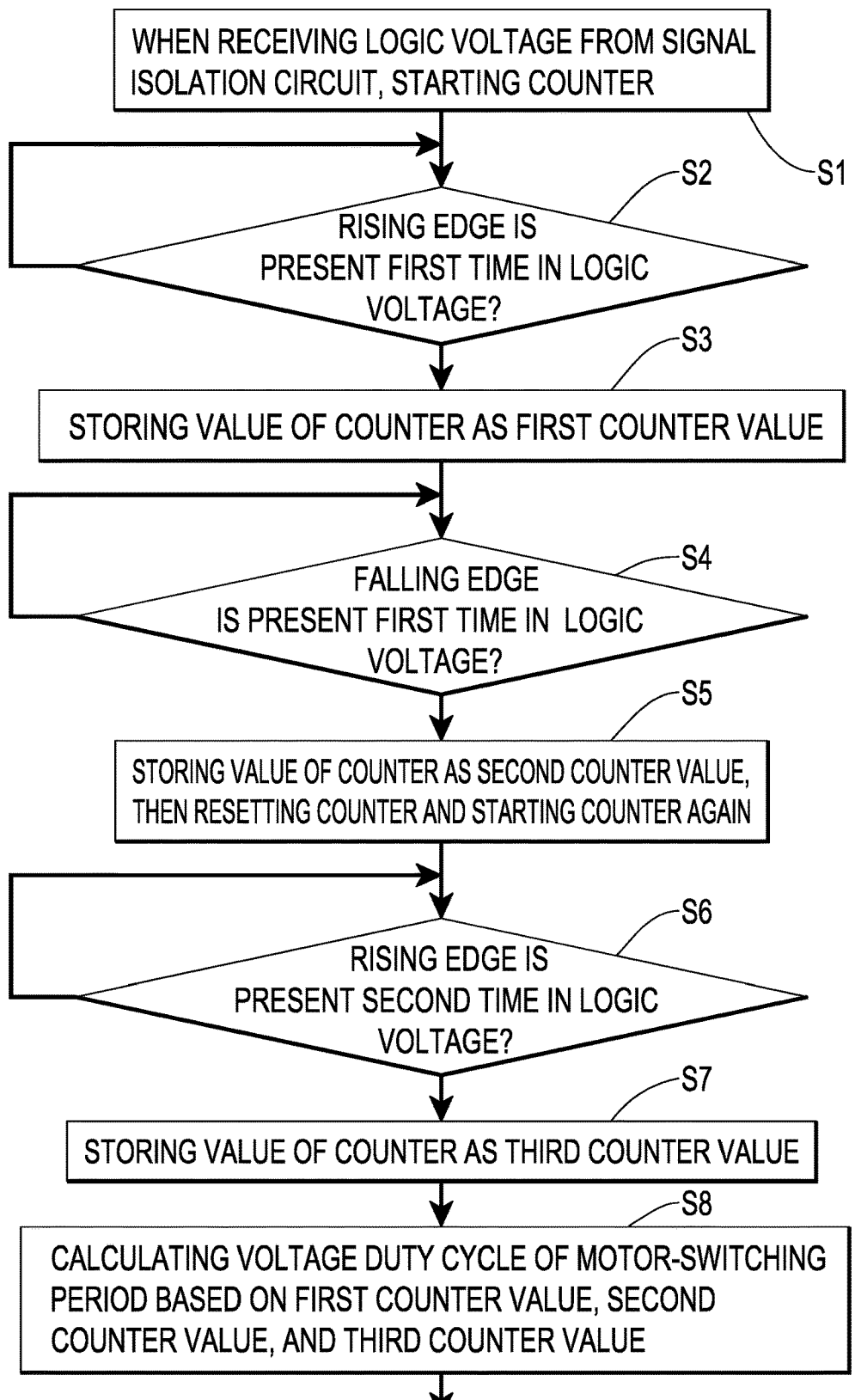
FIG. 5 is a flow chart of an information acquisition method for a pulsating voltage of the present invention.

With reference to FIG. 5, regarding aforementioned technical features, the present invention can be generalized into the information acquisition method for the pulsating voltage that is executed by the signal processing module 20. The information acquisition method for the pulsating voltage includes the following steps:

Step S1: when receiving a logic voltage from a signal isolation circuit, starting a counter.

Step S2: determining whether a rising edge is present in the logic voltage for a first time; when determining the rising edge is absent in the logic voltage for the first time, executing step S2.

Step S3: when determining the rising edge is present in the logic voltage for the first time, storing the value of the counter as a first counter value.

Step S4: determining whether a falling edge is present in the logic voltage for a first time; when determining the falling edge is absent in the logic voltage for the first time, executing step S4.

Step S5: when determining the falling edge is present in the logic voltage for the first time, storing the value of the counter as a second counter value, then resetting the counter and starting the counter again.

Step S6: determining whether the rising edge is present in the logic voltage for a second time; when determining the rising edge is absent in the logic voltage for the second time, executing step S6.

Step S7: when determining the rising edge is present in the logic voltage for the second time, storing the value of the counter as a third counter value.

Step S8: calculating a voltage duty cycle of a motor-switching period based on the first counter value, the second counter value, and the third counter value.

In an embodiment, the signal processing module 20 uses multiple flags to determine whether the rising edge or the falling edge has appeared for the first time or for the second time. For example, when the signal processing module 20 determines that the rising edge has not appeared even once according to a flag, then logically the signal processing module 20 would know the next rising edge appearance would be a first-time appearance of the rising edge. When the signal processing module 20 determines that the rising edge has appeared once but not twice according to another flag, then logically the signal processing module 20 would know the next rising edge appearance would be a second-time appearance of the rising edge. Similar logic applies to the signal processing module 20's understanding of a number of appearances of the falling edge. Furthermore, the calculation of the voltage duty cycle mentioned in step S8 has been thoroughly explored in previous parts of the detailed description, and therefore is hereby omitted for conciseness in descriptions.

Figure 6:
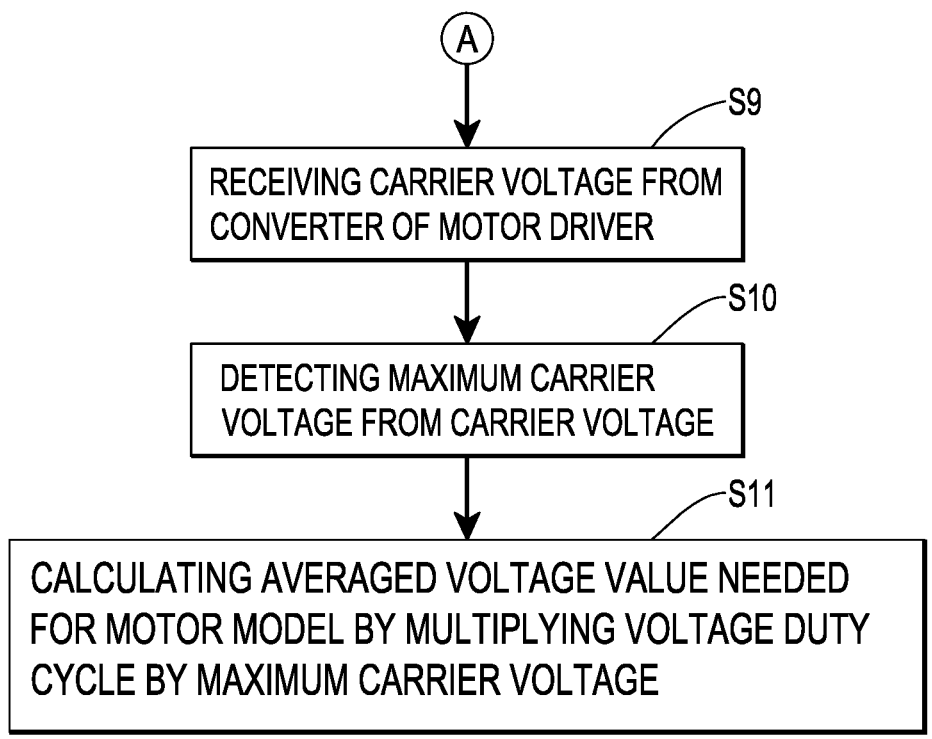
FIG. 6 is another flow chart of the information acquisition method of the present invention.

With reference to FIG. 6, in an embodiment, the information acquisition method also includes the following steps:

Step S9: receiving a carrier voltage from a converter of a motor driver, wherein the carrier voltage is periodic.

Step S10: detecting a maximum carrier voltage from the carrier voltage.

Step S11: calculating an averaged voltage value needed for a motor model by multiplying the voltage duty cycle by the maximum carrier voltage.

What is claimed is:

1. An information acquisition device for a pulsating voltage, comprising:
a signal isolation circuit, utilized for receiving a switch-controlling voltage of a motor driver, and outputting a logic voltage based on the switch-controlling voltage of the motor driver; and
a signal processing module, electrically connected to the signal isolation circuit; wherein when the signal processing module receives the logic voltage from the signal isolation circuit, the signal processing module starts a counter, and determines whether a rising edge or a falling edge is present in the logic voltage;
wherein when the signal processing module determines that the rising edge is present in the logic voltage for a first time, the signal processing module stores a value of the counter as a first counter value;
wherein when the signal processing module determines that the falling edge is present in the logic voltage for a first time, the signal processing module stores the value of the counter as a second counter value, then resets the counter and starts the counter again;
wherein when the signal processing module determines that the rising edge is present in the logic voltage for a second time, the signal processing module stores the value of the counter as a third counter value;
wherein the signal processing module then calculates a voltage duty cycle of a motor-switching period based on the first counter value, the second counter value, and the third counter value.

2. The information acquisition device as claimed in claim 1, wherein the signal processing module uses the following formula for calculating the voltage duty cycle:

$$D = \frac{2(C_2 - C_1)}{2C_2 + C_3 - C_1}$$

wherein D represents the voltage duty cycle, $C_1$ represents the first counter value, $C_2$ represents the second counter value, and $C_3$ represents the third counter value.

3. The information acquisition device as claimed in claim 1, wherein the signal processing module is utilized to receive a carrier voltage of a converter of the motor driver;
wherein the carrier voltage is periodic, and the signal processing module detects a maximum carrier voltage from the carrier voltage and proceeds to calculate an averaged voltage value needed for a motor model by multiplying the voltage duty cycle by the maximum carrier voltage.

4. The information acquisition device as claimed in claim 1, wherein the signal isolation circuit stores an upper voltage threshold and a lower voltage threshold, with the upper voltage threshold being greater than the lower voltage threshold;
wherein when the switch-controlling voltage received by the signal isolation circuit is between the upper voltage threshold and the lower voltage threshold, the signal isolation circuit outputs the logic voltage that has been noise-filtered to the signal processing module.

5. The information acquisition device as claimed in claim 1, further comprising:
a voltage divider, electrically connected to the signal isolation circuit; wherein when the voltage divider receives a motor-switch voltage from a converter of the motor driver, the voltage divider divides the motor-switch voltage into the switch-controlling voltage of a lower voltage value, and the voltage divider outputs the switch-controlling voltage to the signal isolation circuit.

6. The information acquisition device as claimed in claim 1, wherein the signal processing module is an enhanced capture module within a digital signal processor.

7. An information acquisition method for a pulsating voltage, executed by a signal processing module, and comprising the following steps:
when receiving a logic voltage from a signal isolation circuit, starting a counter, and determining whether a rising edge or a falling edge is present in the logic voltage;
when determining that the rising edge is present in the logic voltage for a first time, storing a value of the counter as a first counter value;
when determining that the falling edge is present in the logic voltage for a first time, storing the value of the counter as a second counter value, then resetting the counter and starting the counter again;
when determining that the rising edge is present in the logic voltage for a second time, storing the value of the counter as a third counter value; and
calculating a voltage duty cycle of a motor-switching period based on the first counter value, the second counter value, and the third counter value.

8. The information acquisition method as claimed in claim 7, wherein the step of calculating the voltage duty cycle of the motor-switching period based on the first counter value, the second counter value, and the third counter value uses the following formula to calculate the voltage duty cycle:

$$D = \frac{2(C_2 - C_1)}{2C_2 + C_3 - C_1}$$

wherein D represents the voltage duty cycle, $C_1$ represents the first counter value, $C_2$ represents the second counter value, and $C_3$ represents the third counter value.

9. The information acquisition method as claimed in claim 8, further comprising the following steps:
receiving a carrier voltage from a converter of a motor driver, wherein the carrier voltage is periodic;
detecting a maximum carrier voltage from the carrier voltage; and
calculating an averaged voltage value needed for a motor model by multiplying the voltage duty cycle by the maximum carrier voltage.

10. The information acquisition method as claimed in claim 7, wherein the signal isolation circuit stores an upper voltage threshold and a lower voltage threshold, with the upper voltage threshold being greater than the lower voltage threshold;
wherein when a switch-controlling voltage received by the signal isolation circuit is between the upper voltage threshold and the lower voltage threshold, the signal isolation circuit outputs the logic voltage that has been noise-filtered to the signal processing module.

11. The information acquisition method as claimed in claim 7, wherein when a voltage divider receives a motor-switch voltage from a converter of a motor driver, the voltage divider divides the motor-switch voltage into a switch-controlling voltage of a lower voltage value, and the voltage divider outputs the switch-controlling voltage to the signal isolation circuit.

* * * * *